US005760620A

United States Patent [19]

Doluca

[11] Patent Number: 5,760,620
[45] Date of Patent: Jun. 2, 1998

[54] CMOS LIMITED-VOLTAGE-SWING CLOCK DRIVER FOR REDUCED POWER DRIVING HIGH-FREQUENCY CLOCKS

[75] Inventor: Sinan Doluca, Cupertino, Calif.

[73] Assignee: Quantum Effect Design, Inc., Santa Clara, Calif.

[21] Appl. No.: 635,620

[22] Filed: Apr. 22, 1996

[51] Int. Cl.$^6$ .............................. H03F 3/26; H03K 17/16; H03K 19/003

[52] U.S. Cl. .......................... 327/112; 327/108; 327/379; 326/83

[58] Field of Search .......................... 327/112, 379, 327/313, 321, 327, 328, 288, 378, 108, 109, 111, 323, 312; 326/83, 24, 23, 27, 121, 21, 30, 82, 80, 81

[56] References Cited

U.S. PATENT DOCUMENTS

| | | | |
|---|---|---|---|
| 4,730,275 | 3/1988 | Baskett | 365/174 |
| 4,894,564 | 1/1990 | Sakashita et al. | 307/465 |
| 4,963,766 | 10/1990 | Lundberg | 307/451 |
| 5,051,625 | 9/1991 | Ikeda et al. | 326/27 |
| 5,134,316 | 7/1992 | Ta | 307/475 |
| 5,231,311 | 7/1993 | Ferry et al. | 307/443 |
| 5,313,118 | 5/1994 | Lundberg | 307/451 |
| 5,355,391 | 10/1994 | Horowitz et al. | 375/36 |
| 5,369,316 | 11/1994 | Chen et al. | 326/83 |
| 5,389,834 | 2/1995 | Kinugasa et al. | 326/121 |
| 5,391,939 | 2/1995 | Nonaka | 326/83 |
| 5,416,371 | 5/1995 | Katayama et al. | 327/57 |
| 5,437,269 | 8/1995 | Dickinson | 326/93 |
| 5,438,278 | 8/1995 | Wong et al. | 326/27 |
| 5,453,705 | 9/1995 | Atallah et al. | 326/86 |
| 5,463,331 | 10/1995 | Kuo | 326/86 |
| 5,469,120 | 11/1995 | Nguyen et al. | 331/177 R |
| 5,587,678 | 12/1996 | Dijkmans | 327/379 |

FOREIGN PATENT DOCUMENTS

| | | | |
|---|---|---|---|
| 1-195720 | 8/1989 | Japan | 326/27 |
| 1-209813 | 8/1989 | Japan | 326/27 |
| 3-175730 | 7/1991 | Japan | 326/27 |
| 5-191259 | 7/1993 | Japan | 326/27 |

Primary Examiner—Timothy P. Callahan
Assistant Examiner—Eunja Shin
Attorney, Agent, or Firm—Stuart T. Auvinen

[57] ABSTRACT

A buffer or driver circuit drives a high-capacitance clock signal line inside an integrated circuit (IC). Power is reduced by limiting the voltage swing of the clock output. The clock voltage swing is limited to within a transistor threshold-voltage of power and ground by feeding the output voltage back to the gates of the driver transistors which drive the output clock signal line. Thus the output clock swings from Vtn to Vcc−|Vtp| rather than from ground to Vcc. The limited output swing reduces dynamic power which is more critical than static power in downstream logic receiving the clock for higher-speed clocks. Crowbar current from power to ground through the driver transistors is eliminated by turning off the active driver transistor before the complementary driver is turned on. The gates of the driver transistors are charged and discharged from the clock line capacitance rather than from power and ground. This sequencing is accomplished by a delay in switching feedback transistors after the gate of the active driver transistor is tied to power or ground by a tie-off transistor. Bleeder transistors may be added to the clock output to reduce static power if the clock may be stopped or slowed down.

12 Claims, 7 Drawing Sheets

5,760,620

CMOS LIMITED-VOLTAGE-SWING CLOCK DRIVER FOR REDUCED POWER DRIVING HIGH-FREQUENCY CLOCKS

BACKGROUND OF THE INVENTION

1. Field of the Invention

This invention relates to CMOS integrated circuits, and more particularly for a clock driver or buffer circuit for driving a high-speed clock with lower power dissipation.

2. Description of the Related Art

Large synchronous integrated circuits (ICs) often require that a clock signal be driven to a large clock network or net. The clock signal may have a very large fan-out, being distributed to hundreds or thousands of gates or clocked cells. Clock drivers often resemble output buffers since several pico-farads of clock-signal capacitance may have to be driven. Advancing technologies allow for larger number of gates to be integrated onto a single silicon die, further increasing the number of gates driven by a single clock driver.

Power reduction is also a desirable objective, since portable and low-power systems must not drain a battery too quickly. Even desktop systems must reduce power consumption to prevent thermal damage and to meet EPA energy star requirements.

Complementary metal-oxide-semiconductor (CMOS) transistor technology enables higher integration and lower power consumption. Power is reduced by driving signals to either the power supply or to ground—intermediate voltages increase power consumption because both of the complementary transistors can be left on.

Typical CMOS clock drivers drive the clock signal to the power rails: Vcc and ground. Conventional thought is that any logic receiving the clock signal uses minimal power since one of the complementary transistors is shut off when the clock signal is at power or ground.

FIG. 1 is a diagram of a typical prior-art clock driver. An input voltage Vin to the clock driver is applied to the gates of transistors 12, 14, whose drains drive Vout onto a clock signal line 17. Clock signal line 17 is a large clock net, having large distributed capacitances due to the metal-line capacitance and the gate capacitance of inputs receiving the clock signal. For example, inverter 16 and flip-flop 18 each receive clock signal line 17, as do many other gates.

Power is consumed by the clock driver of FIG. 1 due to three currents. The input current $i_{in}$ is the current from an upstream stage (not shown) which drives Vin. As Vin changes, the charge on the gate of transistors 12, 14 changes, requiring a flow of current. The output current, $i_{out}$ is supplied by transistors 12, 14 to charge and discharge the capacitances of clock signal line 17. This is a large current when clock signal line 17 is large or has a high fan-out as is common in many modern ICs. The third current, $i_{crowbar}$ flows through both of transistors 12, 14 between power and ground but does not charge or discharge clock signal line 17. Current $i_{crowbar}$ is known as the crowbar current, and essentially bleeds charge from power to ground without performing any useful work. The crowbar current is a pure waste of power.

FIGS. 2A–2D show the currents in the clock driver of FIG. 1 as a function of the input, output, and threshold voltages of transistors 12, 14. As the input voltage Vin transitions from the ground to power supply Vcc, the output Vout falls from Vcc to ground, but with a slight propagation delay as shown in FIG. 2A. Initially when the input is at ground, p-channel transistor 12 is shut off in the cut off region of operation, while n-channel transistor 14 is conducting in the linear region of operation. As Vin rises to the n-channel transistor threshold voltage Vtn, n-channel transistor 14 begins to conduct current. Since p-channel transistor 12 is also conducting, the crowbar current can flow between power and ground through transistors 12, 14. Once the input voltage Vin rises to a threshold below power, Vcc–|Vtp|, p-channel transistor 12 turns off and the crowbar current ends, as shown in FIG. 2B.

The input current flows as the input voltage Vin rises, but essentially stops once the gates of transistors 12, 14 are fully charged, as FIG. 2C highlights. The output current begins after the input rises above Vtn, when n-channel transistor 14 starts conducting to discharge the capacitances on clock signal line 17. Since large capacitances require time to discharge through n-channel transistor 14, the output current may continue after the input voltage Vin has finished transitioning as FIG. 2D shows.

Prior-art buffers and drivers have taught several circuits to reduce or eliminate the crowbar current. See for example U.S. Pat. No. 5,231,311 to Ferry et al. and assigned to VLSI Technology, Inc., also U.S. Pat. No. 5,438,278 to Wong et al. assigned to Advanced Micro Devices. Feedback from the output has been used in some buffers, such as U.S. Pat. No. 5,453,705 to Atallah et al. assigned to IBM, and U.S. Pat. No. 5,134,316 to Ta, which is assigned to VLSI Technology, Inc. While these prior-art circuits are effective, it is desired to provide additional reductions of not just the output swing but also the crowbar current and input and output currents, especially when using very high speed clocks.

Power is consumed by each of the three currents: input current, output current, and crowbar current. It is desirable to reduce these currents and thus reduce power consumption in the clock driver. It is especially desired to reduce or eliminate the crowbar current, but it is also desired to reduce the input and output currents. It is desired to provide a relatively simple clock driver circuit rather than a complex and difficult-to-implement driver circuit.

SUMMARY OF THE INVENTION

A buffer circuit drives an output with a reduced voltage swing. The buffer circuit has an input signal which indicates when the output is to change. A delay element is coupled to the input signal. It generates a delayed input signal.

A pull-up transistor conducts current between the output and a power supply. The pull-up transistor has a gate connected to a first control node. A first tie-off transistor conducts current between the power supply and the first control node. The first tie-off transistor has a gate controlled by the input signal.

A first feedback transistor conducts current between the output and the first control node. The first feedback transistor has a gate controlled by the delayed input signal.

A pull-down transistor conducts current between the output and ground. The pull-down transistor has a gate connected to a second control node. A second tie-off transistor conducts current between ground and the second control node. The second tie-off transistor has a gate controlled by the input signal. A second feedback transistor conducts current between the output and the second control node. The second feedback transistor has a gate controlled by the delayed input signal.

In further aspects of the invention the pull-up transistor, the first tie-off transistor, and the first feedback transistor are all p-channel transistors while the pull-down transistor, the second tie-off transistor, and the second feedback transistor are all n-channel transistors.

In other aspects the output is coupled to a clock line. The clock line is an internal clock line within an integrated circuit. The clock line is not connected to any bonding pad of the integrated circuit. The clock line is a high-frequency clock with a frequency of at least 50 MHz, and the input signal is a clock having a frequency equal to the high-frequency clock.

In other aspects a first bleeder means is coupled to the output and the power supply. It conducts current from the power supply to the output when the pull-up transistor has finished driving the output high. A second bleeder means is coupled to the output and ground, and it conducts current from ground to the output when the pull-down transistor has finished driving the output low.

In other aspects the bleeder transistors and the feedback are disabled when the clock frequency drops below a predetermined value or is programmed off. Thus the buffer acts as a standard full-swing buffer when the clock frequency is low or the reduced-swing feature is programmed off.

DETAILED DESCRIPTION

The present invention relates to an improvement in clock driver circuits. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

High-speed clocks dissipate much more power than lower-speed clocks because the capacitances of the clock signal line are charged and discharged more frequently. Each charge and discharge cycle dissipates power. The inventor has realized that power dissipation may be reduced by limiting the voltage swing on the output clock line. While limiting the voltage swing has been used by memory arrays and sense amplifiers to improve speed, (See U.S. Pat. No. 4,730,275) conventional wisdom is that CMOS clocks should drive rail-to-rail to minimize total power consumption. Full-rail clocks ensure that downstream logic receiving the clocks operate with one of the complementary transistors turned off, thus reducing static power consumption.

Difficult to Drive High-Speed Clocks Fully to Power and Ground

Figure 3:
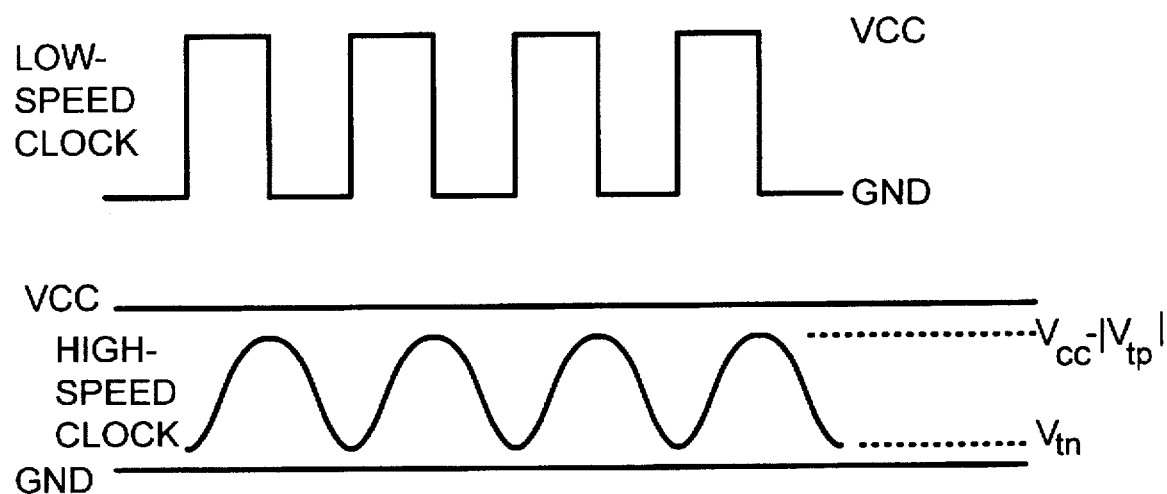
FIG. 3 illustrates a high-speed clock that has a period too short to fully drive the output to power and ground.

The inventor has also realized that high speed clocks often do not have enough time in a cycle to fully drive to power and ground. FIG. 3 illustrates a high-speed clock that has a period too short to fully drive the output to power and ground. While the ideal waveform for the clock when operating at a low frequency is a square wave, with the clock reaching power and ground, clock drivers that operate at extremely high frequencies do not have sufficient time to drive the clock output all the way to power and ground. The resulting high-speed clock output appears more like a rounded sine wave than a square wave.

Clock drivers can be increased in size so than the clock output drives more fully to power and ground, but the larger driver transistors dissipate more current. The crowbar current in particular increases with simple clock-driver designs.

Failures may occur when peaks and troughs of the rounded waveform of the high-speed clock do not reach the transistor threshold voltage levels Vtn and Vcc−|Vtp|. However, as long as the clock reaches these critical threshold levels, the fact that the clock does not drive fully to power and ground does not cause logic or circuit failures.

Reduced Swing Decreases Dynamic Power But Increases Static Power

Indeed, not driving the clock all the way to power and ground can reduce the dynamic charging and discharging currents. A smaller voltage swing requires that less charge be moved to and from the capacitances on the clock signal line. For very fast clocks, the dynamic current to charge and discharge the clock-line capacitances can easily surpass the static currents of the downstream logic receiving the clock signal. When the high-speed clock is driven with a reduced voltage swing, the dynamic power savings can be greater than the static power consumed by downstream logic which is no longer driven to the power-supply rails.

Figure 4:
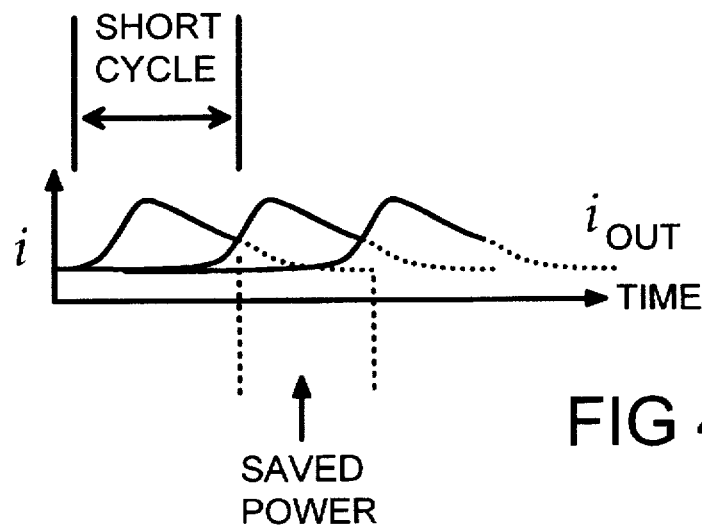
FIG. 4 shows a graph of output current for a high-speed clock having a period so short that the clock output is not fully charged.

FIG. 4 shows a graph of output current for a high-speed clock having a period so short that the clock output is not fully charged. Power is saved because the clock cycle ends before the clock line is fully charged. The tail of the output current is clipped off as shown in FIG. 4. The tail clipped off is saved power, output current that no longer flows due to the shortened cycle.

Figure 1:
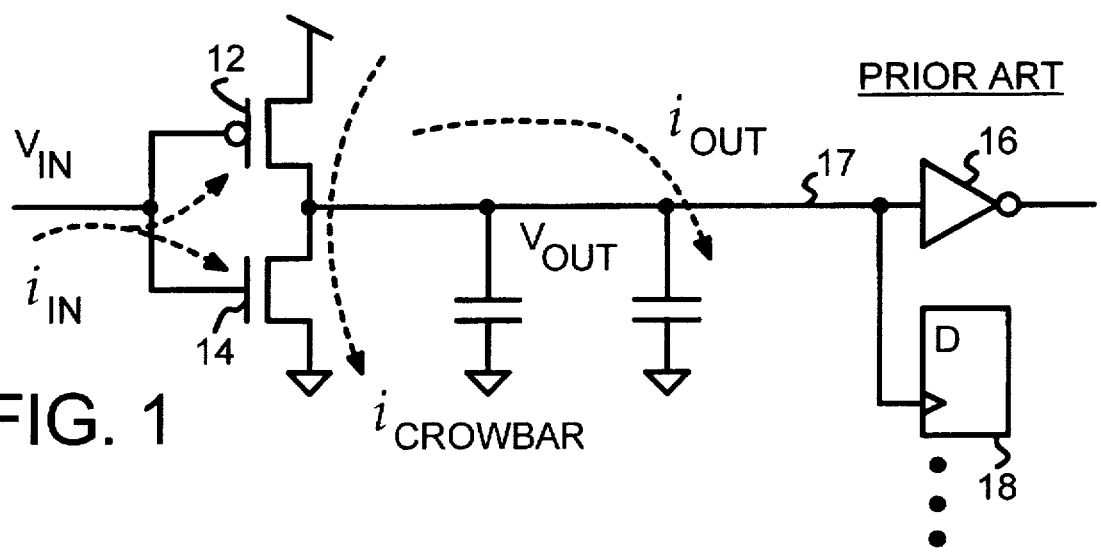
FIG. 1 is a diagram of a typical prior-art clock driver.
Figure 2A:
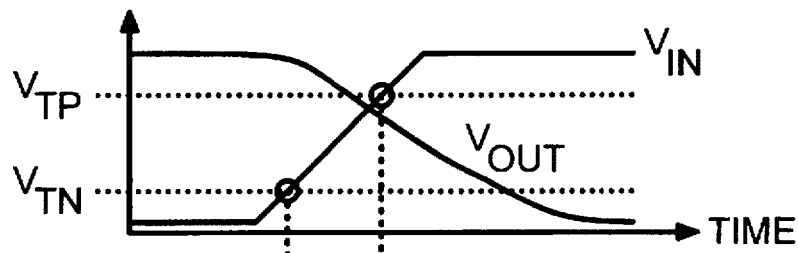
FIGS. 2A–2D show the currents in the clock driver of FIG. 1 as a function of the input, output, and threshold voltages of transistors.
Figure 2B:
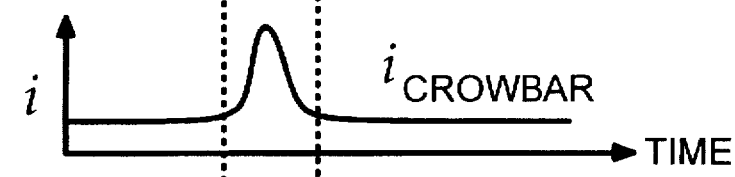
Figure 2C:
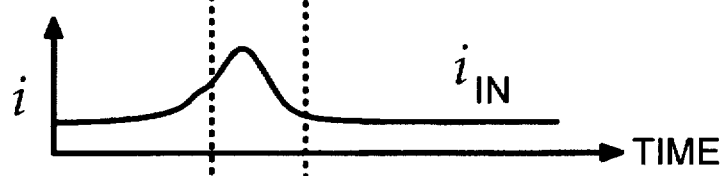
Figure 2D:
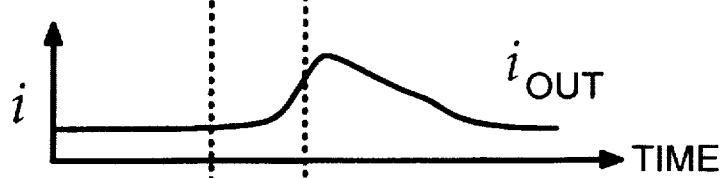

Simply driving the clock faster or slower is not always effective for reducing power because process and temperature variations affect a standard clock driver such as the one shown in FIG. 1. Thus for some conditions power is reduced, but for other conditions power is not reduced. Cold temperatures and fast process variations increase the drive of the clock driver, causing the output voltage swing to increase, which increases power. Another approach must be used to control the clock voltage swing. The invention modifies the clock driver circuit to achieve the limited voltage swing in a controlled manner.

Circuit Schematic of Limited-Voltage Swing Clock Driver

Figure 5:
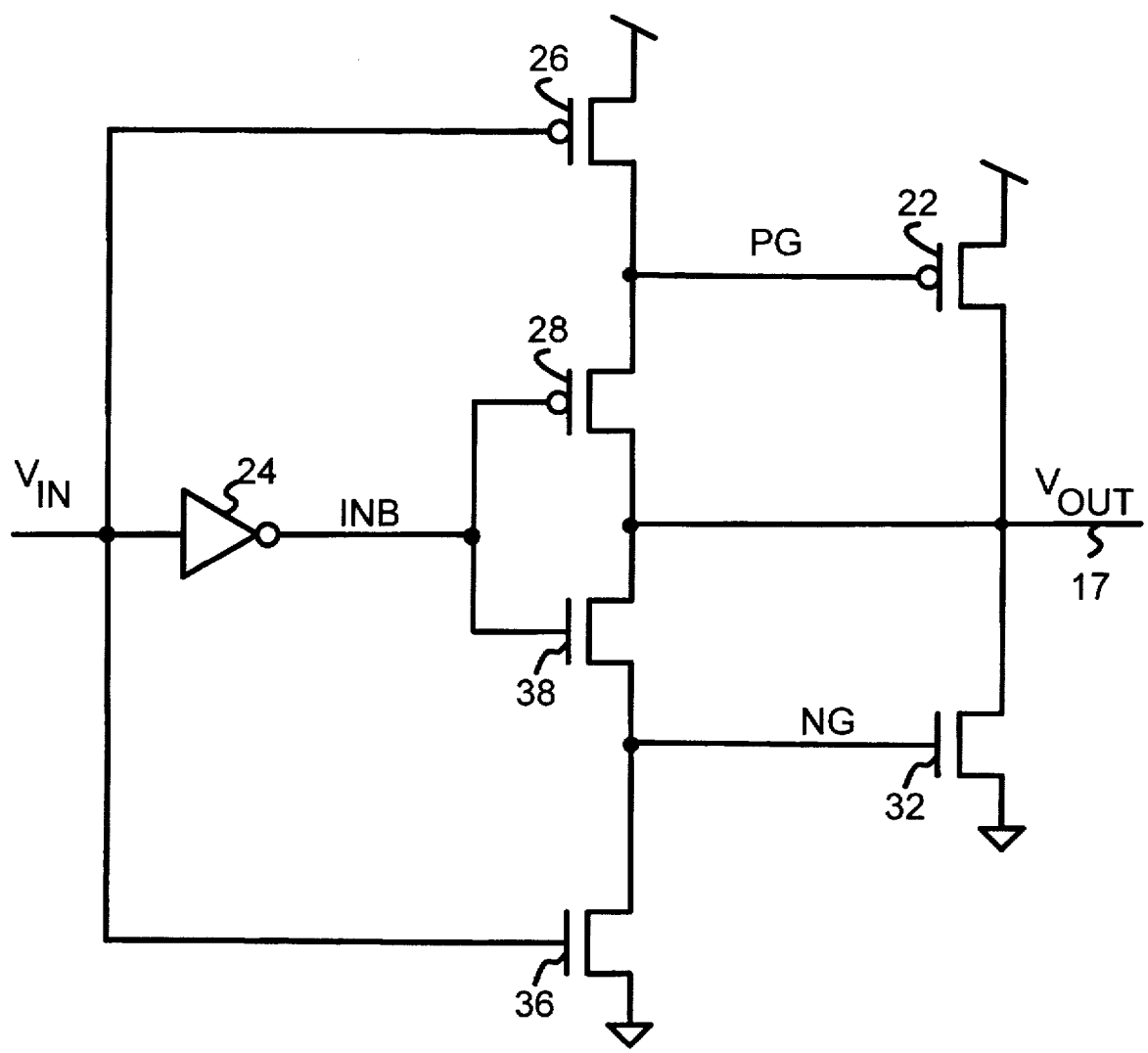
FIG. 5 is a circuit schematic of a non-inverting clock driver having its output voltage swing limited by the transistor thresholds.

FIG. 5 is a circuit schematic of a non-inverting clock driver having its output voltage swing limited by the transistor thresholds. The input voltage, Vin, is a full-rail signal swinging from power to ground, but the output, Vout, has a reduced swing. Vout is driven low to the n-channel transistor threshold voltage, Vtn, but driven high to the p-channel threshold voltage below power, Vcc−|Vtp|. Since the clock driver circuit is non-inverting, Vout rises when Vin rises and falls when Vin falls.

Driver transistors 22, 32 are large transistors with a large transconductance for driving the large capacitances of clock signal line 17. Clock signal line 17 is also connected to the drains of feedback transistors 28, 38. Feedback transistors 28, 38 are not used to directly drive current out to clock signal line 17, but are used to control the gates of driver transistors 22, 32 by feeding the output voltage Vout back to the gates of driver transistors 22, 32.

Tie-off transistors 26, 36 are small transistors used to tie off or disable the gates of driver transistors 22, 32. Tie-off transistors 26, 36 are activated before feedback transistors 28, 38 so that the active one of driver transistors 22, 32 is turned off before the other driver transistor becomes active. Turning off one driver transistor before the complementary driver transistor is turned on prevents crowbar current from power to ground through driver transistors 22, 32, since both of driver transistors 22, 32 are not simultaneously on.

Inverter 24 inverts the input voltage Vin to generate signal INB which is applied to the gates of feedback transistors 28, 38. Inverter 24 serves as a delay element to delay a change in Vin from reaching the gates of feedback transistors 28, 38 until tie-off transistors 26, 36 are first switched. This delay introduced by inverter 24 eliminates the crowbar current through driver transistors 22, 32 by delaying the turning on of one driver transistor until the complementary driver transistor is turned off.

Feedback Limits Output Voltage Swing

Feedback transistors 28, 38 operate as pass transistors in the linear region of operation, feeding the output voltage back to the gates of driver transistors 22, 32. Only one of feedback transistors 28, 38 is on at a time, coupling just one of the gates of driver transistors 22, 32 to the output at a time.

Since the gates of driver transistors 22, 32 are coupled to their drains, which is the clock driver output, driver transistors 22, 32 operate as saturated devices in steady-state. This limits the output voltage Vout to a transistor threshold from the power and ground voltages, since saturated devices turn off once the drains and gates are within a threshold of power or ground. Feeding the output voltage back to the gates of driver transistors 22, 32 thus serves to limit the output voltage swing.

OPERATION OF CLOCK DRIVER CIRCUIT

Figure 6:
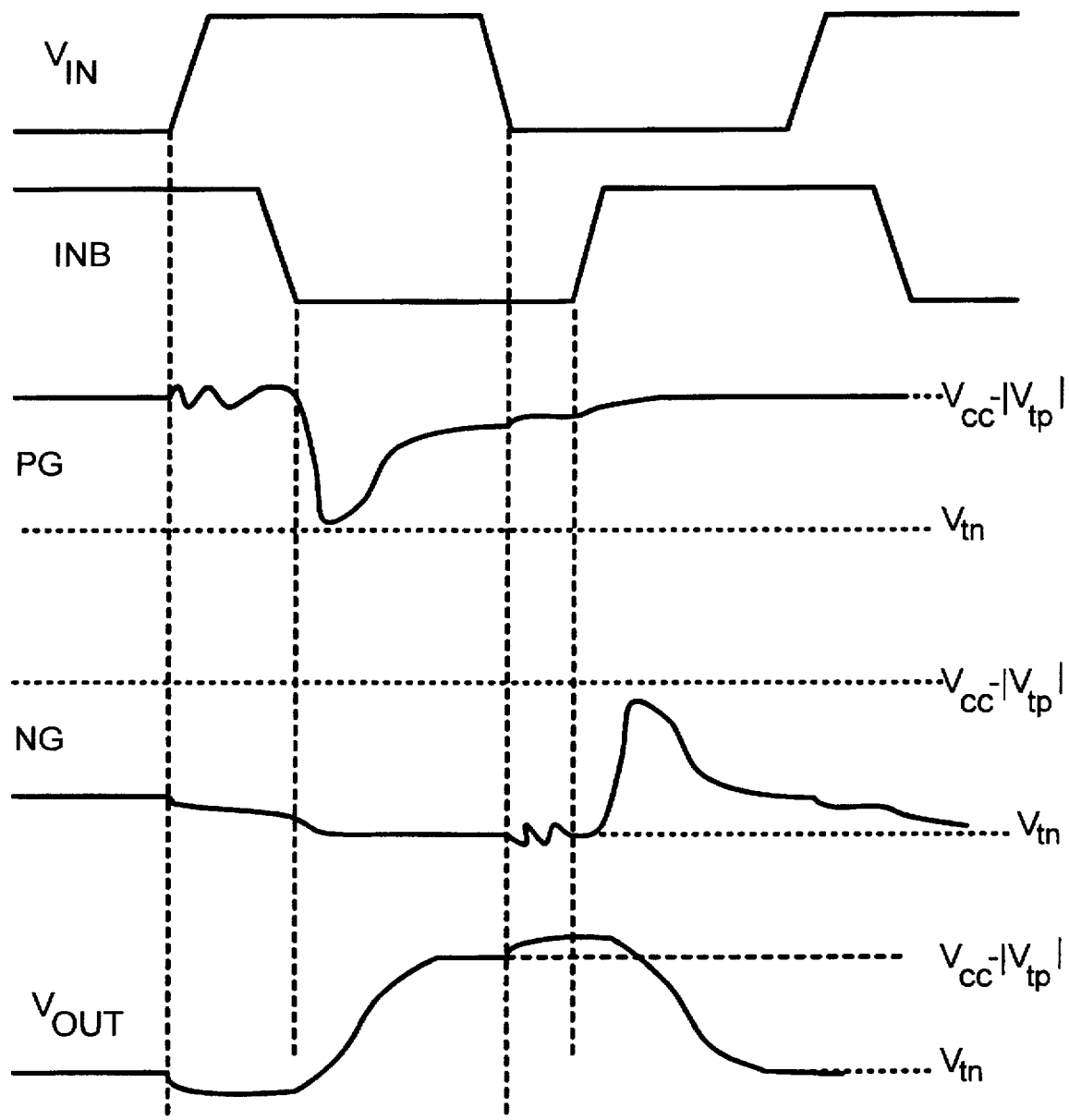
FIG. 6 is a waveform diagram of the operation of the clock driver circuit of FIG. 5.

FIG. 6 is a waveform diagram of the operation of the clock driver circuit of FIG. 5. As the input voltage Vin to the clock driver changes, inverter 24 generates INB with a delay. The gate of p-channel driver transistor 22 is labeled "PG", while the gate of n-channel driver transistor 32 is labeled "NG" in both FIGS. 5 and 6.

Table 1 shows the conditions of the various transistors in FIG. 5 as the input Vin changes. Changes in signal inputs and transistor operation are shown in bold.

TABLE 1

Operation of Clock Driver

| Vin<br>INB | | | Low<br>High | High<br>High | High<br>Low | Low<br>Low | Low<br>High |
|---|---|---|---|---|---|---|---|
| Driver | P | 22 | Off | Off | On | Off | Off |
|  | N | 32 | On | Off | Off | Off | On |
| Tie-Off | P | 26 | On | Off | Off | On | On |
|  | N | 36 | Off | On | On | Off | Off |
| Feedback | P | 28 | Off | Off | On | On | Off |
|  | N | 38 | On | On | Off | Off | On |

Initially, with Vin low, n-channel driver transistor 32 is on but p-channel driver transistor 22 is off, and Vout is low, at Vtn. The n-channel feedback transistor 38 is on and n-channel tie-off transistor 36 is off, connecting NG to the output voltage Vout. P-channel feedback transistor 28 is off and p-channel tie-off transistor 26 is on, clamping PG to power.

As Vin rises, Tie-off transistors 26, 36 switch state, with the n-channel turning on but the p-channel turning off. Since both feedback transistor 28 and tie-off transistor 26 are now off, PG is left floating momentarily but stays near the power-supply voltage keeping driver transistor 22 off. N-channel tie-off transistor 36 turning on pulls NG to ground slowly, as n-channel feedback transistor 38 is also still on. The output Vout is pulled lower slightly, but the very large capacitance on the output and the weak drive of transistors 36, 38 slow the swing below Vtn. However, since Vout is already at the n-channel transistor threshold Vtn, just a small drop in NG is sufficient to turn off n-channel driver transistor 32. At this point, both driver transistors 22, 32 are off, preventing crowbar current at the transition.

After the change in Vin propagates through inverter 24 to the gates of feedback transistors 28, 38, INB transitions low. Feedback transistors 28, 38 switch state so that the p-channel is on but the n-channel is off. Node NG is now quickly pulled to ground by tie-off transistor 36 as NG is isolated from the output voltage Vout. However, node PG first equalizes with the output clock signal line 17, which causes PG to fall quickly to match the low voltage of Vout, which is initially about Vtn. Once PG is equalized with clock signal line 17 through feedback transistor 28, then the gate of p-channel driver transistor 22 is low, at about Vtn. Thus p-channel driver transistor 22 is turned on and starts to pull clock signal line 17 up. Once the output voltage Vout rises to the p-channel transistor threshold below power, the voltage on node PG, the gate of p-channel driver transistor 22, is also at Vcc−|Vtp|, and p-channel driver transistor 22 is at the edge of saturation and stops conducting, just keeping Vout at Vcc−|Vtp|. This is shown on the Vout waveform on FIG. 6.

The next transition of the input signal Vin is a low-going transition. The process described above is reversed. First tie-off transistors 26, 36 switch, floating node NG but connecting node FG to the power supply. P-Channel driver transistor 22 turns off after its gate, PG rises slightly above Vcc−|Vtp|.

After the transition of Vin is delayed by inverter 25, feedback transistors 28, 38 switch. Node PG is isolated from the output, which allows tie-off transistor 26 to pull FG all the way to Vcc. The floating node NG is then connected to the output, and equalization occurs with the voltage of the small node NG being pulled high through feedback transistor 38 by the larger capacitance on the output, clock signal line 17.

Once the gate of n-channel driver transistor 32 is pulled up above Vtn, it turns on and starts to pull clock signal line 17 low. Once the output voltage Vout reaches Vtn, then n-channel driver transistor 32 is at the edge of saturation and turns off, leaving clock signal line 17 at Vtn.

Thus the output is actively driven from Vtn to Vcc−|Vtp|, although the output may move below Vtn or closer to Vcc briefly at the switch point. This has not been observed in practice due to the speed of operation compared to the capacitive loads in the circuit. The limited voltage swing of the clock signal line reduces dynamic current.

Figure 7:
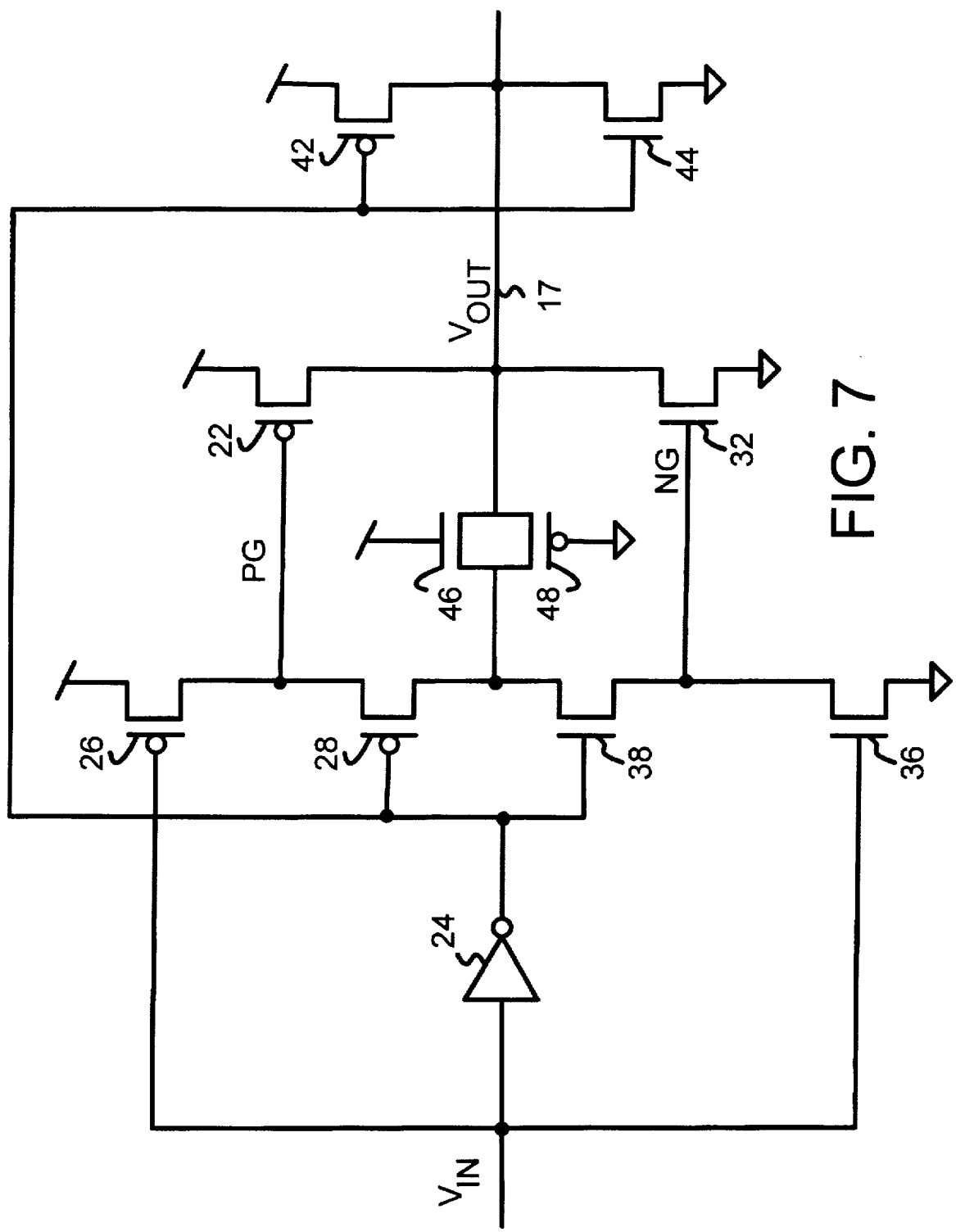
FIG. 7 shows that adding two small bleeder transistors can reduce static/sub-threshold current when the clock is stopped or slowed down.

FIG. 7 shows that adding two small bleeder transistors 42, 44 can reduce sub-threshold currents in the circuits receiving the clock when the clock is stopped or slowed down. Bleeder transistors 42, 44 have their drains connected to output clock signal line 17 and supply a small current from power or ground to slowly pull the clock to the power or ground voltage.

The gates of bleeder transistors 42, 44 are driven by inverter 24, so that bleeder transistors 42, 44 switch state after the inverter delay.

Since bleeder transistors 42, 44 are small, little current flows through them and thus their contribution to the crowbar current is negligible. Small sub-threshold currents flow in downstream transistors when the gate voltage is near or below Vtn or near or above Vcc−|Vtp|. These sub-threshold currents are eliminated in steady-state by bleeder transistors 42, 44 when clock signal line 17 is pulled fully to the rails.

A transmission gate 46, 48 may also be added to the feedback path to provide an IR drop for the purpose of shaping the Vout waveform and to make the voltage swing adjustable. The gates of transmission gate 46, 48 are tied to power and ground to ensure that transmission gate 46, 48 is always conducting.

Figure 8:
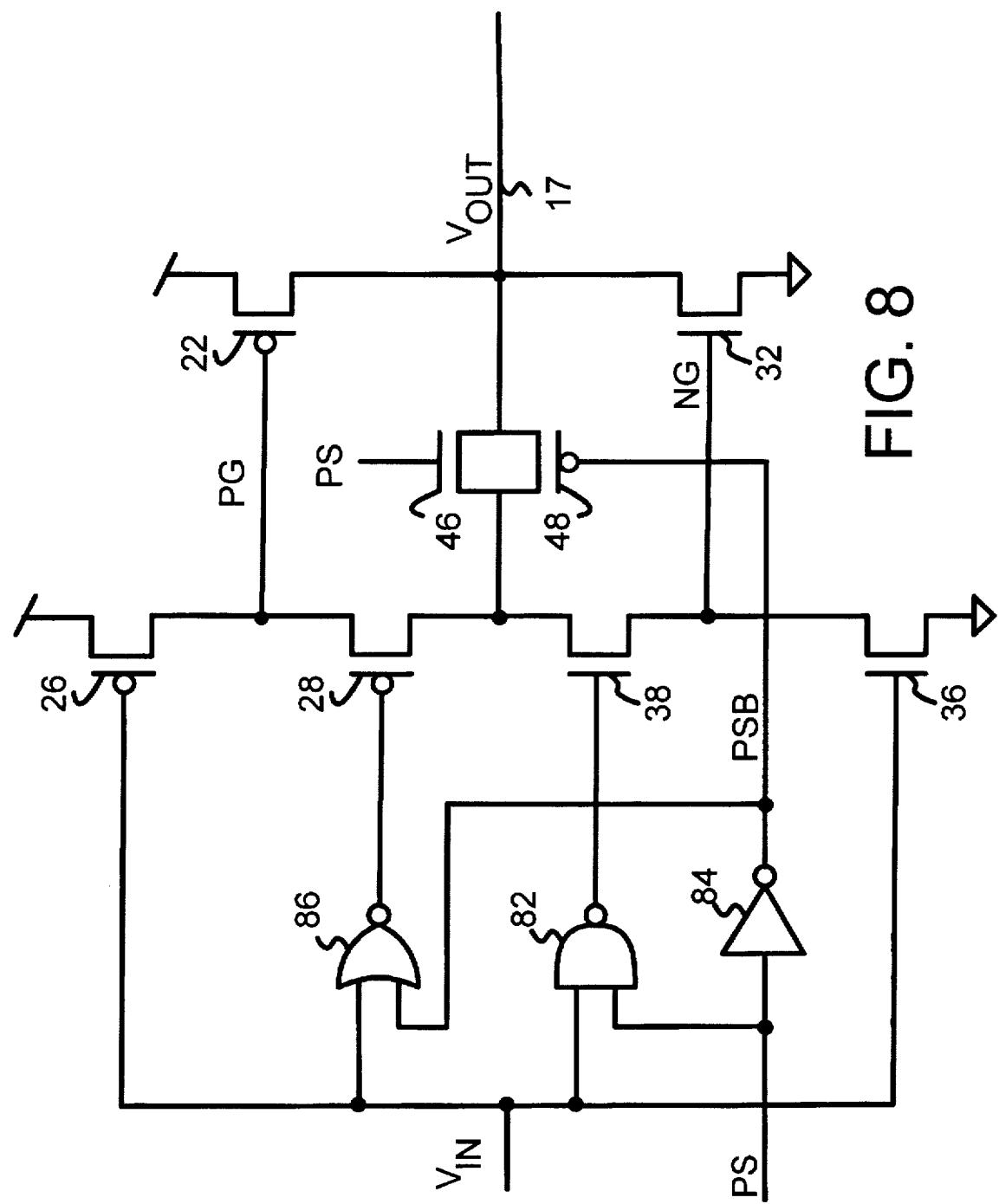
FIG. 8 shows another alternative clock driver where the power-savings feature can be disabled.

FIG. 8 shows another alternative clock driver where the power-savings feature can be disabled. The circuit of FIG. 8 acts in the same manner as FIG. 5 when power-save mode signal PS is set high, activating the power-save mode where Vout is driven with reduced voltage swing.

When PS is low, power-save mode is disabled. NOR gate 86 drives a low to the gate of transistor 28, while NAND gate 82 drives a high voltage to the gate of transistor 38. Thus when PS=0, feedback transistors 28, 38 are left on. However, transmission gate 46, 48 is disabled, disconnecting the output from the drains of feedback transistors 28, 38. Since feedback transistors 28, 38 are always on when power-save mode is off, tie-off transistors 26, 36 act as a simple inverter, with node PG always connected to node NG through feedback transistors 28, 38.

NOR gate 86 and NAND gate 82 act as inverters when power-save signal PS is high, indicating power-saver mode. Thus the power-savings feature may be disabled. PS may be driven by a frequency detector which detects when the frequency of the clock output drops below a set value, such as 50 MHz. Once the clock slows below the limit, the power-savings mode is disabled by setting signal PS to zero.

Figure 9:
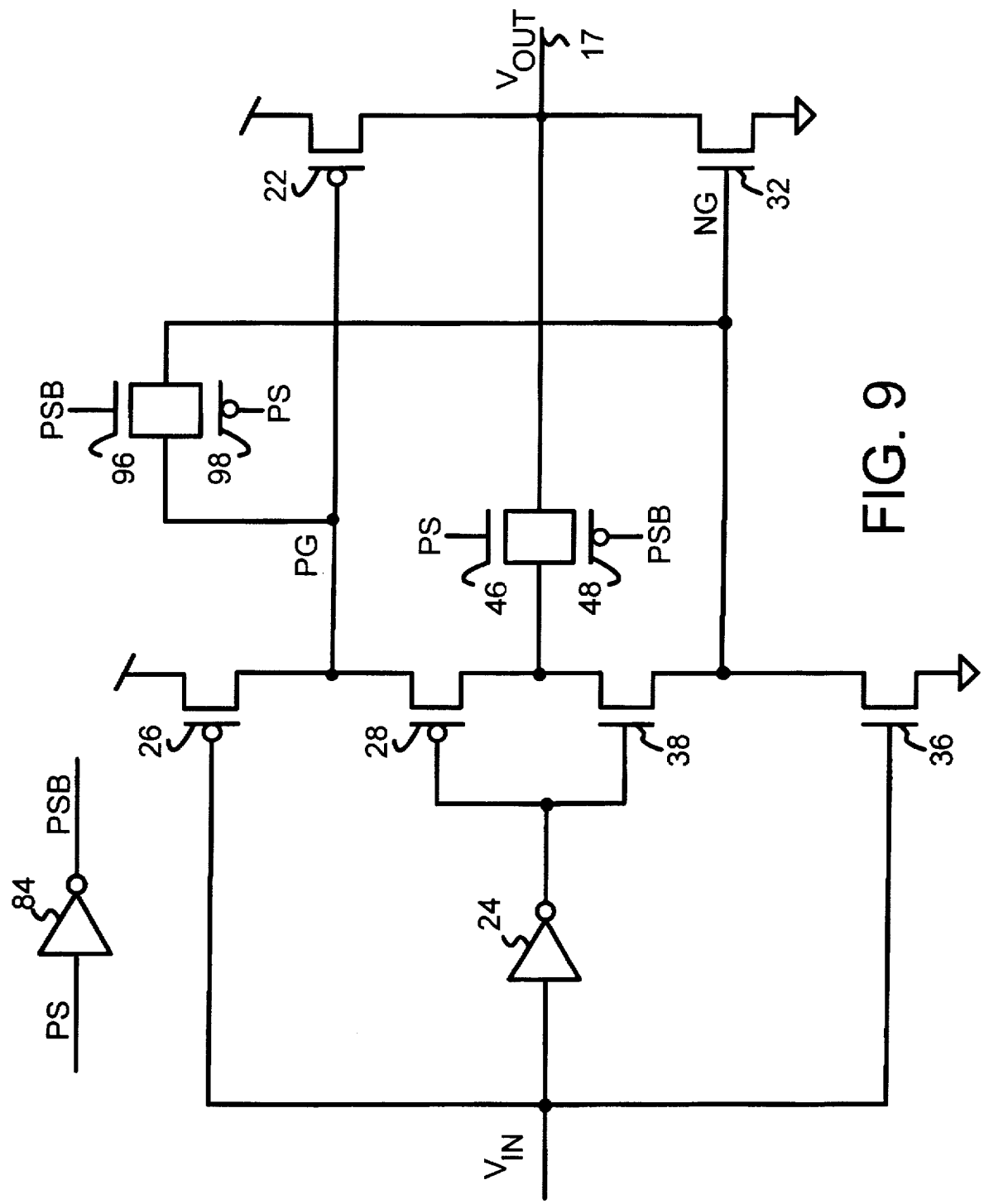
FIG. 9 shows another alternative clock driver where the power-savings feature can be disabled.

FIG. 9 shows another alternative clock driver where the power-savings feature can be disabled. The circuit of FIG. 9 acts in the same manner as FIG. 5, except that transistors 96, 98 form a transmission gate connecting node PG to node NG when power save mode is disabled. Transistors 46, 48 disconnect Vout from feedback transistors 28, 38 when power save mode is disabled. Inverter 84 generates the complement of the power-save-mode signal, PSB.

Transistor Device Sizes

As an example, the circuit of FIG. 7 when implemented on a 1-micron process may use the device sizes shown in Table 2, in microns. These sizes may be varied considerably and scaled to other process technologies.

TABLE 2

Example of Device Sizes

| Transistor | | | Size, W/L |
|---|---|---|---|
| Driver | P | 22 | 216/1 |
| | N | 32 | 72/1 |
| Tie-Off | P | 26 | 16/1 |
| | N | 36 | 3/1 |
| Feedback | P | 28 | 16/1 |
| | N | 38 | 3/1 |
| Inverter | P | 24 | 7/1 |
| | N | 24 | 4/1 |
| Bleeder | P | 42 | 2/1 |
| | N | 44 | 2/2 |
| Transmission Gate | P | 48 | 24/1 |
| | N | 46 | 8/1 |

ADVANTAGES AND APPLICATIONS

The limited voltage swing of the clock signal line reduces dynamic output current. For a 3.3-volt process with Vtn=|Vtp|=0.6 volts, the clock swing is reduced by 1.2 volt (0.6×2) from 3.3 volts to 2.1 volts. This is a savings of 1.2/3.3=36% of the dynamic current. Additionally, the power consumption on the input to the clock driver is also eliminated, since the large driver transistors of the clock driver are buffered by the feedback and tie-off transistors. This reduces the input current. Thus all three currents are reduced or eliminated—the input, output, and crowbar currents. Circuit simulations with SPICE comparing the reduced-swing clock driver to a prior-art inverter driver show a current savings of 80% of the input current, 36% of the output current, and all of the crowbar current, for an overall savings of 50%.

The reduced voltage swing reduces the noise generated by the clock drivers. The voltage swing can couple noise into power and ground nodes, but the reduced swing reduces this noise. Smaller process geometries can increase this coupling and noise generation. The gates of the driver transistors are charged and discharged from the clock line capacitance through transistors 28, 38 rather than from power and ground. This further reduces power consumption.

Very high-speed clocks are more common in today's higher-speed processors. For example, multipliers and pipelined processors require clocks to latch data at each stage. Multipliers can operate at up to 800 MHz while CPU pipelines commonly operate at 100 to 200 MHz. At these high speeds, the dynamic current is very large. Limiting the voltage swings of the clocks can save considerable power. Even portable systems can use the invention with either embodiment shown in FIGS. 7 or 8 to finish driving the clock to the power rails when clocks are stopped.

ALTERNATE EMBODIMENTS

Several other embodiments are contemplated by the inventor. For example a simple inverter is used as a delay element, but other kinds of delay elements may be substituted. A non-inverting buffer or a delay line may be used as long as the signals to the feedback transistors is inverted relative to the signal to the tie-off transistors. Inverters may be added to the path to the gates of the tie-off transistors as long as the delay for the path to the feedback transistors is greater. Complementary inputs signals may also be used in place of the delay element or inverter.

Device sizes can vary dramatically with the process and design guidelines, and can be varied over wide ranges from the example given. The invention may also be used for applications other than clock drivers, for driving other high-capacitance lines. Additional transistors or passive elements may be added to the circuit described. Another alternative embodiment is to eliminate logic gates 46, 48, but only add transmission gates 46, 48 with their gates tied to power and ground to leave them on.

This transmission gate is then an example of a passive element. The transistors may also be indirectly connected to the power rails, perhaps connecting through another transistor such as a level-shift transistor.

The power supply voltage is preferably 3.0 or 3.3 volts, but 5-volt systems and other power-supply voltages may be used. Transistor threshold voltages are nominally 0.6 volt in the 1-micron process, but other threshold voltages may be used. The threshold voltage also varies with substrate bias and channel length as is well-known. The inherent advantages of this invention actually increases with reduced power-supply voltages. Thus power-supply voltages below 3.3 volts may benefit from the invention, such as a 2.5-volt supply.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

I claim:

1. A clock driver circuit for driving a clock line, the clock driver circuit comprising:

a driver means, coupled to the clock line, for driving the clock line to a maximum voltage and a minimum voltage, wherein the maximum voltage is less than a power-supply voltage of a power supply and the minimum voltage is greater than a ground voltage of a ground supply, the driver means comprising:

a pull-up transistor coupled between the clock line and the power supply, the pull-up transistor having a first control gate coupled to both a feedback means and the disable means; and a pull-down transistor coupled between the clock line and the ground supply the pull-down transistor having a second control gate coupled to both the feedback means and the disable means;

feedback means, coupled to the clock line and coupled to the driver means, for feeding back an output voltage on the clock line to a control gate of the driver means, the feedback means comprising:

a first feedback transistor for transmitting the output voltage to the first control gate when the pull-up transistor is driving the clock line to the maximum voltage; and a second feedback transistor for transmitting the output voltage to the second control gate when the pull-down transistor is driving the clock line to the minimum voltage;

disable means, coupled to the driver means, for disabling the driver means from driving; and staggering means, coupled to the feedback means and coupled to the disable means, for staggering feeding back the output voltage until the disable means has disabled the driver means;

wherein the maximum voltage is limited to a maximum of about a threshold voltage of the pull-up transistor below the power-supply voltage of the power supply and wherein the minimum voltage is limited to a minimum of about a threshold voltage of the pull-down transistor above the ground voltage of the ground supply, whereby the output voltage swings are limited to the threshold voltage of the pull-down transistor to the power-supply voltage less the threshold voltage of the pull-up transistor.

2. The clock driver circuit of claim 1 wherein the staggering means comprises an inverter for delaying an input signal to the clock driver circuit to produce a delayed input, the delayed input being coupled to the feedback means but the input signal being coupled to the disable means.

3. The clock driver circuit of claim 2 wherein the disable means comprises:

a first disable transistor for coupling the first control gate of the driver means to the power supply when the driver means is disabled from driving to the maximum voltage, the first disable transistor having a control gate coupled to the input signal; and a second disable transistor for coupling the second control gate of the driver means to the ground supply when the driver means is disabled from driving to the minimum voltage, the second disable transistor having a control gate coupled to the input signal.

4. The clock driver circuit of claim 3 wherein the pull-up transistor, the first disable transistor, and the first feedback transistor are all p-channel transistors while the pull-down transistor, the second disable transistor, and the second feedback transistor are all n-channel transistors.

5. The clock driver circuit of claim 4 wherein the clock line is a high-frequency clock having a frequency of at least 50 MHz.

6. A buffer circuit for driving an output with a clamped voltage swing, the buffer circuit comprising:

an input signal for indicating when the output is to change;

a delay element, coupled to the input signal, for generating a delayed input signal;

a pull-up transistor for conducting current between the output and a power supply, the pull-up transistor having a gate connected to a first control node;

a first tie-off transistor for conducting current between the power supply and the first control node, the first tie-off transistor having a gate controlled by the input signal;

a first feedback transistor for conducting current between the output and the first control node, the first feedback transistor having a gate controlled by the delayed input signal;

a pull-down transistor for conducting current between the output and ground, the pull-down transistor having a gate connected to a second control node;

a second tie-off transistor for conducting current between ground and the second control node, the second tie-off transistor having a gate controlled by the input signal; and a second feedback transistor for conducting current between the output and the second control node, the second feedback transistor having a gate controlled by the delayed input signal, wherein a voltage swing of the output is clamped to a transistor-threshold voltage above ground by the second feedback transistor, wherein the pull-down transistor stops conducting current before the output reaches ground when the second control node reaches the transistor-threshold voltage above ground.

7. The buffer circuit of claim 6 wherein the pull-up transistor, the first tie-off transistor, and the first feedback transistor are all p-channel transistors while the pull-down transistor, the second tie-off transistor, and the second feedback transistor are all n-channel transistors.

8. The buffer circuit of claim 7 wherein the output is coupled to a clock line, the clock line being an internal clock line within an integrated circuit, the clock line not connected to any bonding pads of the integrated circuit.

9. The buffer circuit of claim 8 wherein the clock line is a high-frequency clock having a frequency of at least 50 MHz and wherein the input signal is a clock having a frequency equal to the high-frequency clock.

10. The buffer circuit of claim 7 further comprising:
    first bleeder means, coupled to the output and the power supply, for conducting current from the power supply to the output when the pull-up transistor has finished driving the output high;
    second bleeder means, coupled to the output and ground, for conducting current from ground to the output when the pull-down transistor has finished driving the output low.

11. The buffer circuit of claim 10 wherein the first and second bleeder means have insufficient time to drive the output to the power supply or ground when the input signal is a high-frequency clock, but the first and second bleeder means having sufficient time to drive the output to the power supply or ground when the input signal is a low-frequency clock, or a suspended clock.

12. The buffer circuit of claim 7 further comprising programmable means for disconnecting the first and second feedback transistors from the output; the programmable means further comprising:

a shorting p-channel transistor and a shorting n-channel transistor for conducting current between the first and second control nodes when the programmable means disconnects the output from the first and second feedback transistors, whereby the output is not driven with the reduced swing when the programmable means disconnects the output from the first and second feedback transistors.

* * * * *